STEPWAVE CONVERTER

Filed June 28, 1967 3 Sheets-Sheet 1

Spurgeon E. Smith
INVENTOR

BY Arnold, Roylance, Kruger & Durkee
ATTORNEYS

Aug. 25, 1970 S. E. SMITH 3,525,941

STEPWAVE CONVERTER

Filed June 28, 1967 3 Sheets-Sheet 2

Spurgeon E. Smith
INVENTOR

BY Arnold, Roylance, Kruger & Durkee
ATTORNEYS

RELATIVE POWER AT nfo

| n | 2 STEPS / PERIOD | 6 STEPS / PERIOD | 8 STEPS / PERIOD | 16 STEPS / PERIOD |
|---|---|---|---|---|
| 1 | .810 | .912 | .950 | .987 |
| 2 | 0 | 0 | 0 | 0 |
| 3 | .0900 | 0 | 0 | 0 |
| 4 | 0 | 0 | 0 | 0 |
| 5 | .0324 | .0365 | 0 | 0 |
| 6 | 0 | 0 | 0 | 0 |
| 7 | .0165 | .0186 | .0194 | 0 |
| 8 | 0 | 0 | 0 | 0 |
| 9 | .0100 | 0 | .0117 | 0 |
| 10 | 0 | 0 | 0 | 0 |
| 11 | .0067 | .0075 | 0 | 0 |
| 12 | 0 | 0 | 0 | 0 |
| 13 | .0048 | .0054 | 0 | 0 |
| 14 | 0 | 0 | 0 | 0 |
| 15 | .0036 | 0 | .0042 | .0044 |
| 16 | 0 | 0 | 0 | 0 |
| 17 | .0028 | .0032 | .0033 | .0034 |
| 18 | 0 | 0 | 0 | 0 |
| 19 | .0022 | .0025 | 0 | 0 |
| 20 | 0 | 0 | 0 | 0 |

Fig. 4

Spurgeon E. Smith
INVENTOR
BY Arnold, Roylance, Kruger & Durkee
ATTORNEYS

United States Patent Office 3,525,941
Patented Aug. 25, 1970

3,525,941

STEPWAVE CONVERTER

Spurgeon E. Smith, Austin, Tex., assignor to Tracor, Inc., Austin, Tex., a corporation of Texas Filed June 28, 1967, Ser. No. 649,561
Int. Cl. H04b *1/26*
U.S. Cl. 325—442 5 Claims

ABSTRACT OF THE DISCLOSURE

A method and frequency converter for use in a superheterodyne radio receiver wherein an IF signal with suppressed harmonics is produced. The input RF signal is multiplied by a step-approximation sine wave in the converter. The converter includes a square wave mixer or phase inverting switch and a cyclically variable attenuator.

BACKGROUND OF THE INVENTION

This invention relates to radio receivers and in particular to methods and apparatus for performing frequency conversion functions in a superheterodyne radio receiver.

The conventional method of producing an intermediate frequency (IF) signal in a superheterodyne radio receiver has been to mix a modulated input radio frequency (RF) signal with sinusoidal signal from a local oscillator in a superheterodyne mixer or converter. Another method of obtaining an IF signal is by multiplying the input RF signal by a balanced square wave through means of a phase inverting switch or mixer. This latter method has been advantageously employed to provide accurately controlled conversion of signals in the low frequency (LF) and the very low frequency (VLF) ranges. For example, U.S. Pat. No. 3,163,823 discloses such a system. While this method accomplishes precise multiplication of the received signal and the fundamental frequency of the mixer, interaction of the signal and harmonics of the mixer frequency produce odd harmonics of the desired IF signal. These harmonics often have a substantial portion of the total signal energy and are troublesome to eliminate by filtering.

SUMMARY OF THE INVENTION

Briefly, in accordance with this invention, a stepwave frequency converter is provided which produces a desired IF signal while suppressing undesired harmonics by multiplying a modulated input RF signal by a balanced step approximation of a sine wave having a frequency related to the RF signal frequency by an increment equal to the IF signal frequency. The multiplication is preferably accomplished by passing the input signal through a square wave mixer or phase inverting switch and then attenuating the resulting signal in a step variable manner. Alternatively, the input signal may be cyclically attenuated by an attenuator and then passed through the phase inverting switch. The extent of the harmonic suppression depends on how closely the resulting step variable multiplication function of the attenuator and phase inverting switch approximates a sine wave.

The invention will be more fully understood from the following description and appended claims when taken with the drawings.

BRIEF DESCRIPTION OF THE DRAWINGS

FIG. 4 is a table showing the harmonic suppression effect achieved with this invention.

DESCRIPTION OF THE PREFERRED EMBODIMENTS

Figure 1A:
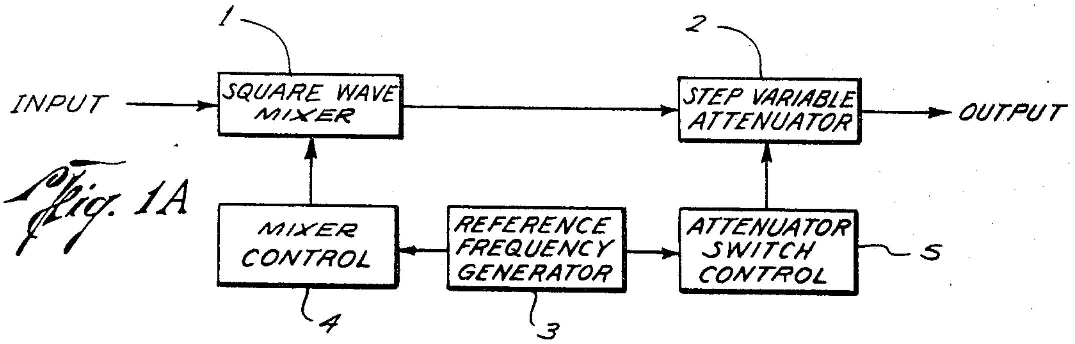
FIGS. 1*a* and 1*b* are block diagrams of two embodiments of the invention.
Figure 1B:
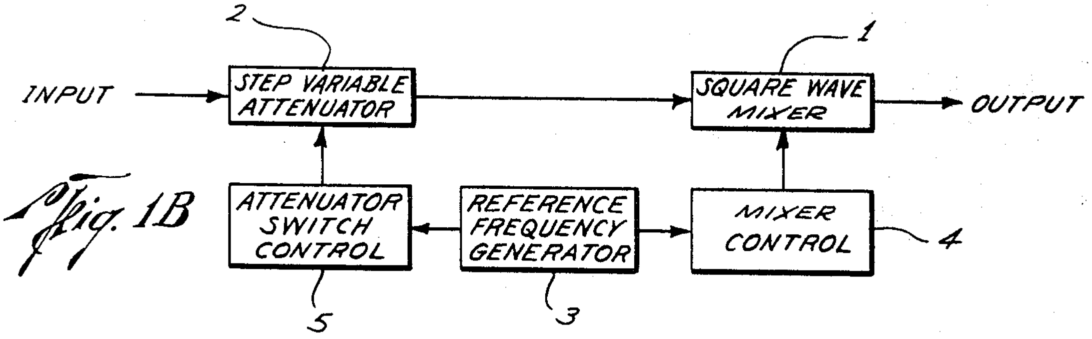

Two means of implementing the method of obtaining a harmonic-free IF signal by multiplying a modulated RF signal by a balanced step approximation of a sine wave in accordance with this invention, are illustrated in the block diagrams in FIGS. 1*a* and 1*b*. In FIG. 1*a* a modulated RF signal is applied to the input of a square wave mixer 1 wherein the RF signal is multiplied by a balanced square wave. The output of the mixer is then passed through a step variable attenuator 2. A reference frequency generator 3 provides timing pulses for the mixer control 4 and the attenuator switch control 5. Alternatively, the input RF signal can be attenuated in the step variable attenuator 2 before the square wave multiplication in the mixer 1, as illustrated in FIG. 1*b*.

Figure 2:
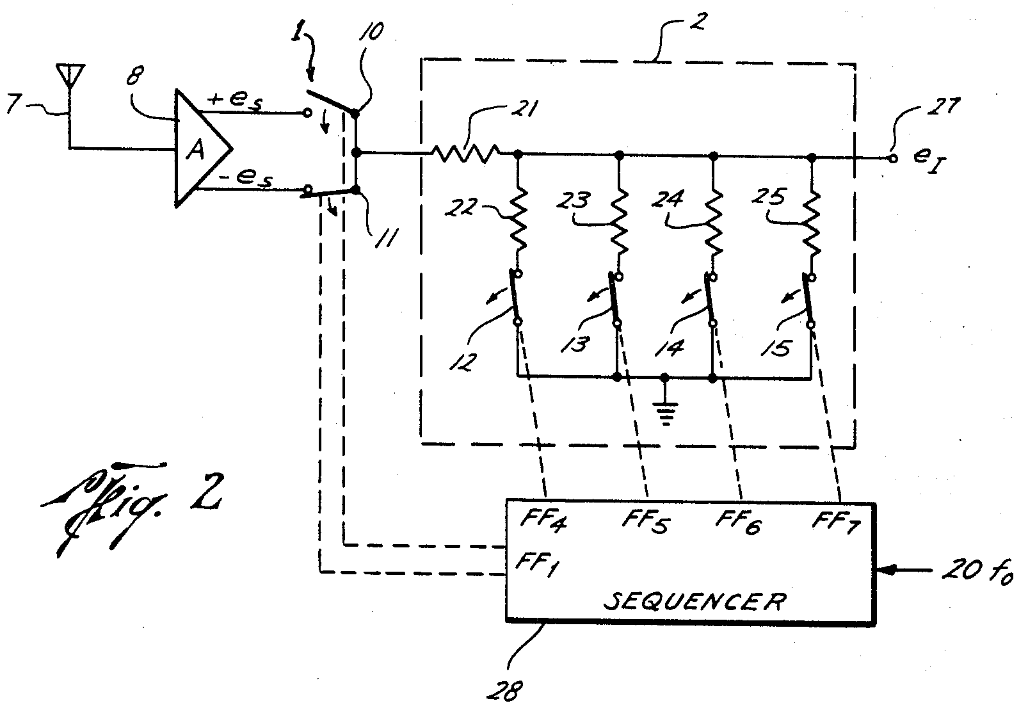
FIG. 2 is a schematic diagram partially in block form further illustrating one embodiment of the invention.

A more detailed diagram of the illustrative embodiment in FIG. 1*a* is shown in FIG. 2. A positive input RF signal, $+e_s$, and a negative input RF signal, $-e_s$, (the two signals being at 180° phase difference) are obtained at the output of amplifier 8 which is connected to receiver antenna 7. A centered-tapped transformer secondary may be used to derive the two signals at 180° phase difference. The two signals are connected to mixer 1 which includes alternately conducting phase inverting switches 10 and 11. The output of the mixer is connected to step variable attenuator 2 which includes series resistor 21 and shunt resistors 22, 23, 24 and 25. The shunt resistors 22–25 are connected through switches 12–15, respectively, to ground. The stepped attenuation of the mixer output is accomplished by the opening and closing of switches 12–15. The switches 10–15 preferably are transistors which are selectively controlled by a sequencer 28.

The sequencer includes five flip-flops which produce the control voltages for the switches in mixer 1 and attenuator 2. These flip-flops are interconnected with two additional flip-flops to produce an appropriate switching program. The illustrated attenuator provides twenty attenuating steps per mixer cycle, therefore the inputs to the flip-flops are connected to a source of trigger pulses having a frequency of twenty times the multiplier frequency, or $20f_0$, so that flip-flop transitions will coincide in time with a trigger pulse.

Figure 3A:
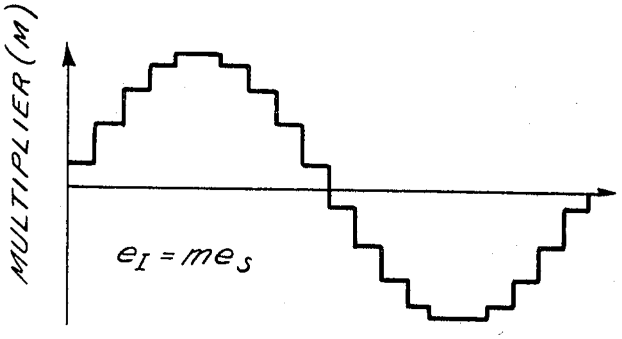
FIGS. 3*a*–3*c* show the phase relationships of the control voltages from the sequencer in FIG. 2 and the resulting step variable multiplication factor.
Figure 3B:
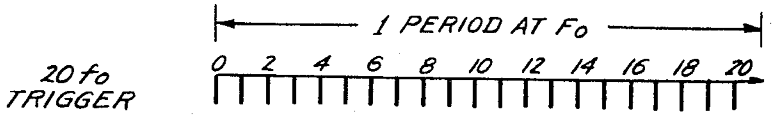
Figure 3C:
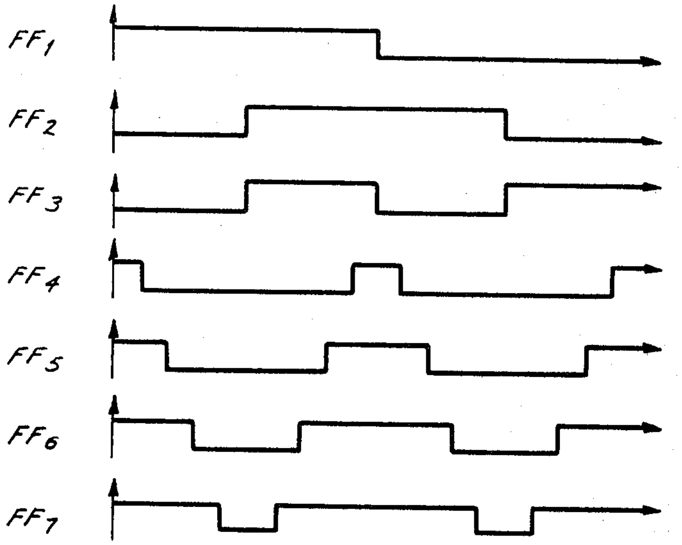

The operation of the sequencer, multiplier, and attenuator is shown graphically in FIGS. 3*a*–3*c*. FIG. 3*a* shows the step-approximation sine wave or multiplication function, M, produced by the cooperative action of the multiplier and attenuator; FIG. 3*b* shows one cycle of the mixer frequency $f_0$ divided into the twenty intervals or steps at which trigger pulses occur; and FIG. 3*c* shows the switching sequence of the seven flip-flops in the sequencer. It is to be noted that the transitions of the flip-flops coincide with a trigger pulse, the sequence being determined by gating circuitry interconnecting the flip-flops. The two transistor switches 10 and 11 in the mixer 1 are controlled by the two outputs of flip-flop 1 (FF1). The switching sequence for the flip-flop 1 output which controls switch 10 is shown in FIG. 3*c*, the upper voltage level of the output forward biasing the switch transistor and thus closing the switch to produce the positive half cycle of the multiplication function M shown in FIG. 3*a*. The other output of flip-flop 1, which is 180° out of phase with the first output, closes switch 11 to produce the negative half cycle of the multiplication function M in FIG. 3*a*.

The voltages produced by flip-flops 4–7 (FF4–FF7) control switches 12–15, respectively, in the attenuator. It is seen in FIG. 3*c* that the voltages step down in sequence to a lower voltage level, which sequentially opens the switches, and then the voltages step up in sequence to an upper voltage level, which sequentially closes the switches.

At the beginning of the cycle of the multiplication function shown in FIG. 3*a*, switches 12–15 in the attenuator are closed thus producing maximum attenuation. Thereafter, the multiplication function increases in a sinusoidal manner in steps as the switches are sequentially opened. After all of the switches are open, they are sequentially closed in a sinusoidal manner, thus decreasing the multiplication function in steps.

As the number of attenuation steps per period of the frequency converter is increased, a sine wave is more closely approximated and consequently the greater harmonic suppression. FIG. 4 is a table showing the relative harmonic power or energy content for a stepwave frequency converter with two, six, eight and sixteen steps per period. No harmonics are suppressed with only two steps per period; six steps per period will suppress the third harmonic; eight steps per period suppresses the third and fifth harmonics; and sixteen steps per period suppresses all harmonics through the thirteenth harmonic. Theoretically, all harmonics will be suppressed when a true sine wave is developed by the converter.

The step wave modulator can be advantageously employed in an image suppressed superheterodyne receiver which utilizes outphasing techniques for image rejection. Outphasing techniques are discussed in a paper entitled, "The Phase-Shift Method of Single Sideband Reception," by Donald E. Norguard, on page 1735 in the Proceedings of the Institute of Radio Engineers, December 1956. In this receiver, two step wave frequency converters are connected in parallel between circuitry which develops the input RF signal and a summing network. Both converters operate at the same frequency, but the phase of one of the converters is shifted by 90°. Thus, the converters can be referred to as in-phase and quadrature-phase, respectively. By proper selection of gating voltages, both converters can be controlled from a single sequencer, such as the sequencer described above. The output of one of the step-wave converters is shifted by 90° and then summed with the output of the other step-wave converter. The image sideband frequency signals from the two converters are 180° out of phase and are cancelled in the summing circuitry, while the desired sideband frequency signals are in-phase and thus are additive in the summer.

From the above description, it is seen that harmonic suppression is achieved by multiplying a modulated input RF signal by a step variable approximation of a sine wave. While the invention has been described with reference to specific embodiments, it is to be understood that the description is illustrative and is not to be construed as limiting the scope of the invention. Various modifications and changes may occur to those skilled in the art without departing from the spirit and scope of the invention as defined by the appended claims.

What is claimed is:

1. In a superheterodyne receiver, means for obtaining an intermediate frequency signal comprising:
(a) a square wave mixer,
(b) means for connecting an RF signal to said mixer,
(c) control means for said mixer whereby said mixer may invert said RF signal at a frequency related to the radio frequency by an increment equal to said intermediate frequency,
(d) a variable attenuator,
(e) means for connecting the inverted signal from said mixer to said attenuator, and
(f) control means for said attenuator whereby said inverted signal may be variably attenuated in a stepped wave sinusoidal manner to produce an output intermediate frequency signal.

2. Means for obtaining an intermediate frequency signal with suppressed harmonics from an RF signal comprising:
(a) a variable attenuator,
(b) means for connecting the RF signal to said attenuator,
(c) control means for said attenuator whereby said RF signal may be cyclically attenuated in steps,
(d) a square wave mixer,
(e) means for connecting the attenuated RF signal from said attenuator to said mixer, and
(f) control means for said mixer whereby said mixer may invert said attenuated RF signal in a stepped wave sinusoidal manner to produce an output intermediate frequency signal.

3. Apparatus for converting a modulate radio frequency signal into a modulated intermediate frequency signal, comprising:
an input and an output having therebetween a signal flow path, said input being adapted to be coupled to a source of modulated radio frequency signal;
an attenuating device connected in said signal flow path, said attenuating device including means for effecting step variable attenuation of a signal with weights according to the envelope of a half cycle of a sine wave, said step variable attenuation including more than one step per half cycle of said sine wave,
a phase reversal device connected in said signal flow path; and
a sequencer coupled to said phase reversal device and said attenuating device, said sequencer being adapted to operate said phase reversal device and said attenuating device in synchronism whereby a radio frequency signal in said flow path is effectively multiplied by a step approximation to said sine wave to produce an intermediate frequency signal.

4. Apparatus as in claim 3 wherein said phase reversal device comprises:
means for producing from a radio frequency signal a pair of signals having opposite phase relationship; and
means for switching between said pair of signals on alternate cycles of said sine wave under control of said sequencer.

5. Apparatus as in claim 3 wherein said attenuating device comprises:
a multibranch resistive network connected to said signal flow path, each branch being connected to a point of low potential with respect to said signal flow path, each branch including a resistance of different value proportioned to points along the envelope of the half cycle of said sine wave; and
a switch connected in each of said branches and being adapted to be controlled by said sequencer, whereby said signal path may be sequentially connected to said point of low potential through one of said branches.

References Cited

UNITED STATES PATENTS

| | | | |
|---|---|---|---|
| 2,592,308 | 4/1952 | Meacham | 325—38 |
| 2,722,660 | 11/1955 | Jones | 325—38 |
| 2,816,267 | 12/1957 | Jager et al. | 325—38.1 |
| 3,382,438 | 5/1968 | Geller. | |
| 3,163,823 | 12/1964 | Kellis et al. | 325—421 |

OTHER REFERENCES

C. Kramer et al.: Electronics, Delta Modulator Codes, Aug. 2, 1963, p. 50.

ROBERT L. GRIFFIN, Primary Examiner

A. J. MAYER, Assistant Examiner

U.S. Cl. X.R.

325—38, 421; 328—28, 186; 332—9